(12) United States Patent
Kim

(10) Patent No.: US 9,070,898 B2
(45) Date of Patent: Jun. 30, 2015

(54) ORGANIC LIGHT EMITTING DISPLAY DEVICE

(71) Applicant: LG DISPLAY CO., LTD., Seoul (KR)

(72) Inventor: Jung Yeon Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/336,788

(22) Filed: Jul. 21, 2014

(65) Prior Publication Data
US 2015/0155522 A1  Jun. 4, 2015

(30) Foreign Application Priority Data
Nov. 29, 2013  (KR) .................. 10-2013-0146953

(51) Int. Cl.
*H01L 51/52* (2006.01)
*H01L 51/10* (2006.01)

(52) U.S. Cl.
CPC .......... *H01L 51/5253* (2013.01); *H01L 51/107* (2013.01)

(58) Field of Classification Search
CPC .............. H01L 51/107; H01L 51/5237; H01L 51/5253
USPC ................................. 313/498–512
See application file for complete search history.

(56) References Cited

U.S. PATENT DOCUMENTS

2012/0267646 A1* 10/2012 Kim .............................. 257/88
2012/0305981 A1* 12/2012 Park et al. .................... 257/100
2013/0248827 A1*  9/2013 Togano et al. ................ 257/40

* cited by examiner

*Primary Examiner* — Anne Hines
(74) *Attorney, Agent, or Firm* — McKenna Long & Aldridge LLP

(57) ABSTRACT

An organic light emitting display device is disclosed which includes: an element substrate provided with a thin film transistor; an organic light emitting element electrically connected to the thin film transistor and formed on the element substrate; a protective layer formed on the organic light emitting element; an adhesive film configured to include a first adhesive layer and a second adhesive layer which are sequentially stacked on the protective layer, the first adhesive layer including a resin layer and the second adhesive layer including another resin layer and a filler; and a sealing substrate disposed on the second adhesive layer and combined with the element substrate, which is provided with the organic light emitting element, by the adhesive film. One of the resin layers of the first and second adhesive layers within the adhesive film is formed from a non-hardening resin layer.

13 Claims, 2 Drawing Sheets

ORGANIC LIGHT EMITTING DISPLAY DEVICE

The present application claims priority under 35 U.S.C. §119(a) of Korean Patent Application No. 10-2013-0146953 filed on Nov. 29, 2013 which is hereby incorporated by reference in its entirety for all purposes as if full set forth herein.

BACKGROUND

1. Field of the Disclosure

The present application relates to an organic light emitting display device. More particularly, the present application relates to an organic light emitting display device adapted to increase a content of filler and prevent contractive faults of pixels which can be caused by the intrusion of moisture.

2. Description of the Related Art

The display field for visually representing an electrical information signal has been rapidly developed with the spread of information society. In accordance therewith, a variety of flat panel display devices with features, such as slimness, light weight and low power consumption have been developed. Also, the flat panel display devices have been rapidly replacing the existing cathode ray tubes (CRTs).

As examples of the flat panel display devices, liquid crystal display (LCD) devices, organic light emitting display (OLED) devices, electrophoretic display (electric paper display (EPD)) devices, plasma display panel device (PDPs), field emission display (FED) devices, electroluminescence display devices (ELDs), elector-wetting display (EWD) devices, and so on can be introduced. Such flat panel display devices commonly include a flat display panel, which realizes an image, as a necessary component. The flat display panel is configured with a pair of combined substrates which face each other and have an inherent light emitting or polarizing material layer therebetween.

The organic light emitting display devices are self-illuminating display devices. As such, the organic light emitting display devices do not need a separate light source which is used in a liquid crystal display device. In accordance therewith, the organic light emitting display devices can become lighter and thinner. Also, the organic light emitting display devices have the features of wider viewing angle, superior contrast, and lower power consumption than those of the liquid crystal display devices. Moreover, the organic light emitting display devices can be driven by a low direct-current voltage and provide a high speed response. Furthermore, the organic light emitting display devices can well resist external impacts and be used in a wide temperature range because of having solid components.

In the organic light emitting diode display device, some electrodes can be damaged by external oxygen and moisture. As such, light can be emitted from some pixel regions. In other words, the external oxygen and moisture greatly deteriorate the device and reduce the lifespan of the organic light emitting diode display device. Therefore, it is very important to package the organic light emitting element to reduce the external oxygen and moisture.

As a packaging method, an entire surface sealing process can be used in the organic light emitting diode display device. In order to protect organic light emitting elements from the intrusion of external moisture, the entire surface sealing process allows an element substrate provided with the organic light emitting elements to be combined with a sealing substrate by means of an adhesive layer which is formed on the entire surfaces of the element substrate and the sealing substrate. The adhesive layer can include filler corresponding to a moisture absorbent, in order to prevent the intrusion of external moisture.

The filler is necessary to protect the organic light emitting element, but has a property of expanding by moisture. If a content of the filler increases, the filler expands by moisture and applies stresses to the element substrate and the sealing substrate. In other words, the adhesive layer between the element substrate and the sealing substrate must be lifted up due to the expansion of the filler which is caused by moisture.

Such a lift defect can force cracks to be generated in the interior of the related organic light emitting display device. The cracks can be used as intrusion paths of external moisture, gas, etc. Due to this, contractive faults can be generated. In order to prevent the lift defect, the content of the filler can be decreased. In this case, it is very difficult to prevent the intrusion of moisture.

BRIEF SUMMARY

Accordingly, embodiments of the present application are directed to an organic light emitting display device that substantially obviates one or more problems due to the limitations and disadvantages of the related art.

The embodiments provide an organic light emitting display device which is adapted to relax strength and prevent the peeling off of an adhesive layer using a low modulus material even though filler absorbs moisture and expands in volume.

Also, the embodiments provide an organic light emitting display device which is adapted to prevent the contractive fault of a pixel due to the intrusion of moisture, enhance the performance of an adhesive layer and increase the lift span in the environment of high temperature and humidity, by increasing a content of filler.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiment for solving the above-mentioned problems, an organic light emitting display device includes: an element substrate provided with a thin film transistor; an organic light emitting element electrically connected to the thin film transistor and formed on the element substrate; a protective layer formed on the organic light emitting element; an adhesive film configured to include a first adhesive layer and second adhesive layer which are sequentially stacked on the protective layer, the first adhesive layer including a resin layer and the second adhesive layer including another resin layer and filler; and a sealing substrate disposed on the second adhesive layer and combined with the element substrate, which is provided with the organic light emitting element, by the adhesive film. One of the resin layers of the first and second adhesive layers within the adhesive film is formed from a non-hardening resin layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiments of the present disclosure and together with the description serve to explain the disclosure. In the drawings.

DETAILED DESCRIPTION OF THE EMBODIMENTS

Figure 1:
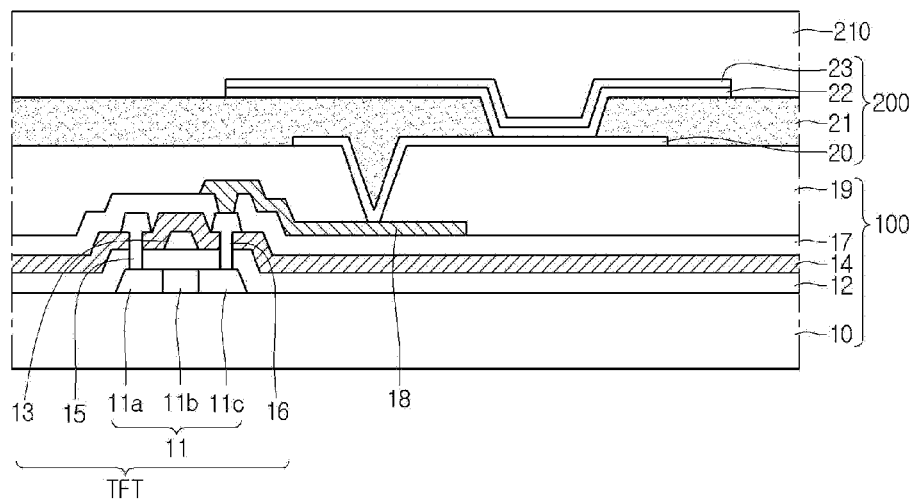
FIG. 1 is a cross-sectional view showing an element substrate and an organic light emitting element of an organic light emitting display device according to the present disclosure.

Reference will now be made in detail to embodiments of the present disclosure, examples of which are illustrated in the accompanying drawings. The embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be enlarged for convenience of explanation. Wherever possible, the same reference numbers will be used throughout the disclosure including the drawings to refer to the same or like parts.

FIG. 1 is a cross-sectional view showing an element substrate and an organic light emitting element of an organic light emitting display device according to the present disclosure.

Referring to FIG. 1, an element substrate 100 of the organic light emitting display device according to the present disclosure is defined to have a display area and a non-display area. The display area is defined by a plurality of pixel regions. Each of the pixel regions includes a thin film transistor TFT and an organic light emitting element 200 electrically connected to the thin film transistor TFT.

The element substrate 100 includes a semiconductor layer 11 formed on an insulation substrate 10. The semiconductor layer 11 includes a source region 11a, a channel region 11b and a drain region 11c. A gate insulation film 12 is formed on the entire surface of the insulation substrate 10 provided with the semiconductor layer 11. A gate line and a gate electrode 13 branched from the gate line are formed on the gate insulation film 12. An interlayer insulation film 14 is formed on the entire surface of the gate insulation film 12 provided with the gate line and the gate electrode 13.

A data line, a source electrode 15 and a drain electrode 16 are formed on the interlayer insulation film 14. The data line and the gate line cross each other with having the interlayer insulation film 14 therebetween and define the pixel region. The source electrode 15 is branched from the data line. The drain electrode 16 is separated from the source electrode 15 by a fixed distance. Also, the source and drain electrodes 15 and 16 are connected to the source and drain regions 11a and 11c of the semiconductor layer 11 via first contact holes each penetrating through the interlayer insulation film 14 and the gate insulation film 12. In this manner, the thin film transistor TFT including the semiconductor layer 11, the gate electrode 13, the source electrode 15 and the drain electrode 16 is formed on the insulation substrate 10.

A passivation film 17 is formed on the entire surface of the interlayer insulation film 14 provided with the source electrode 15 and the drain electrode 16. A second contact hole exposing the drain electrode 15 is formed in the passivation film 17. The exposed drain electrode 16 is electrically connected to a connection electrode 18 which is formed on the passivation film 17. A planarization film 19 is formed on the entire surface of the insulation substrate 10 provided with the thin film transistor TFT and the connection electrode 18. A third contact hole is formed in the planarization film 19.

The organic light emitting element 200 is formed on the planarization film 19 in such a manner as to be electrically connected to the thin film transistor TFT through the third contact hole which is formed in the planarization film 19. The organic light emitting element 200 includes a lower electrode 20, an organic light emission layer 22 and an upper electrode 23.

In detail, the lower electrode 20 is formed on the planarization film 19 in such a manner as to be connected to the exposed connection electrode 18. Although it is shown in the drawing that the lower electrode 20 of the organic light emitting element 200 and the drain electrode 16 of the thin film transistor TFT are connected with each other through the connection electrode 18, the connection electrode 18 can be removed. In this case, the lower electrode 20 of the organic light emitting element 200 can be formed on the planarization film 19 in such a manner as to come in direct contact with the drain electrode 16 of the thin film transistor TFT via a contact hole which penetrates through the planarization film 19 and the passivation film 17.

A bank pattern 21 is formed on the entire surface of the planarization film 19 provided with the lower electrode 20. The bank pattern 21 exposes the lower electrode 20 in a pixel region unit. The organic light emission layer 22 is formed on the exposed lower electrode 20. The organic light emission layer 22 can be configured with a single layer which is formed from a light emission material. Alternatively, in order to raise a luminous efficiency, the organic light emission layer 22 can be configured with multiple layers including a hole injection layer, a hole transport layer, an light emission layer, an electron transport layer and an electron injection layer.

The upper electrode 23 is formed on the organic light emission layer 22. If the lower electrode 20 is used as an anode, the upper electrode 23 is used as a cathode. When the lower electrode 20 is used as a cathode, the upper electrode 23 is used an anode. A protective layer 210 for protecting the display element is formed on the entire surface of the insulation substrate 10 provided with the upper electrode 23. Such element substrate 100 and organic light emitting element 200 of the organic light emitting display device according to the present disclosure are not limited to the above-mentioned embodiment. In other words, various changes or modifications of the element substrate 100 and the organic light emitting element 200 are possible without departing from the spirit of the present disclosure.

Figure 2:
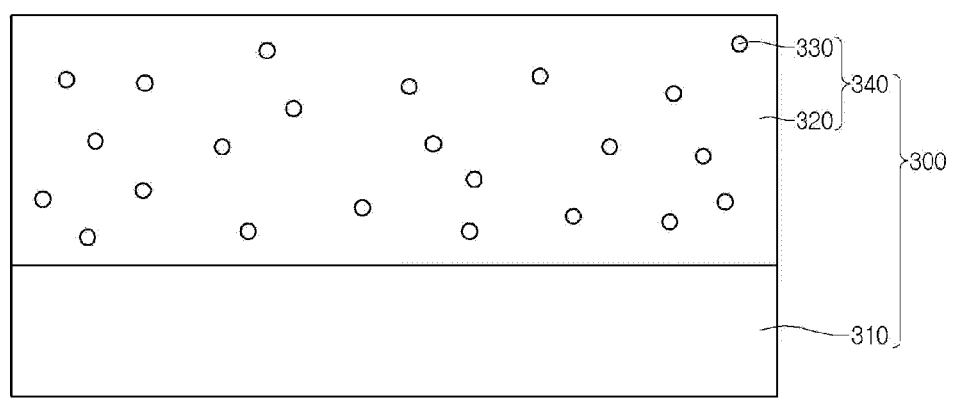
FIG. 2 is a cross-sectional view showing an adhesive film of an organic light emitting display device according to a first embodiment of the present disclosure.

FIG. 2 is a cross-sectional view showing an adhesive film of an organic light emitting display device according to a first embodiment of the present disclosure.

Referring to FIG. 2, an adhesive film 300 of the organic light emitting display device according to a first embodiment of the present disclosure can be configured with a first adhesive layer 310 and a second adhesive layer 340. The first adhesive layer 310 can be configured with only a resin layer, and the second adhesive layer 340 can be configured with a resin layer 320 and filler 330. Also, the first and second adhesive layers 310 and 340 can be formed in a thickness ratio range of 1:3 through 2:3.

The filler 330 included into the second adhesive layer 340 is used as a moisture absorbent, in order to prevent the organic light emitting element from the intrusion of moisture. The filler 330 can be compounded of at least one selected from a material group which includes lithium oxide, sodium oxide, barium oxide, calcium oxide, magnesium oxide, lithium sulfate, sodium sulfate and calcium sulfate. Also, the filler 330 has a property of expanding by moisture.

The related organic light emitting display device can increase a content of the filler 330. In this case, the filler 330 expands by moisture and applies stresses to the element substrate, the sealing substrate and so on. As such, lift defects can be generated in the related organic light emitting display device. Due to this, not only cracks can be generated in the interior of the related organic light emitting display device, but also moisture, gas and so on are easily intruded into the organic light emitting element. In view of this point, it is difficult for the related organic light emitting display device to increase the content of the filler 330.

The adhesive film 300 according to the present disclosure can allow the resin layer of the first adhesive layer 310 or the resin material 320 of the second adhesive layer 340 to become a non-hardening resin layer. As such, stress caused by the expansion of the filler 330 can be relaxed even though a content of the filler 330 increases and the filler 330 expands by moisture. In order to prevent the lift defect, the related organic light emitting display device must include about 20 wt % of filler with respect to the adhesive layer, but the filler of the organic light emitting display device according to the present disclosure can increase about twice through triple compared to that of the related organic light emitting display device. In other words, the filler 330 included into the second adhesive layer 340 of the organic light emitting display device according to the present disclosure can become about 40 through 60 wt % with respect to the second adhesive layer 340.

The non-hardening resin layer can be from a low modulus resin material. The modulus can be obtained by dividing a maximum load, within a range that a material does not lose its elastic force, into a cross-sectional area. The low modulus means that a film can be modified or deformed by a small force at a tension test.

The non-hardening resin layer according to the present disclosure can be from a resin material with a modulus range of about 0.1~900 MPa. Preferably, the non-hardening resin layer can be formed from a resin material with a modulus range of 200~300 MPa. The non-hardening resin layer can be formed from at least one selected from a material group which includes a polyolefine-based resin material, a polyacrylic-based resin material, isobutylene, polyamide and polyimide.

Both of the resin layers of the first adhesive layers 310 and the resin layer 340 of the second adhesive layer 340 can be formed from the non-hardening resin layer. For example, the resin layer of the first adhesive layer 310 and the resin layer 320 of the second adhesive layer 340 can be formed from a low modulus resin material. In other words, the resin layer of the first adhesive layer 310 and the resin layer 320 of the second adhesive layer 340 can be formed from the same material.

Alternatively, the resin layer of the first adhesive layer 310 and the resin layer 320 of the second adhesive layer 340 can be formed from different materials from each other. In this case, one of the first adhesive layer 310 and the resin layer 320 of the second adhesive layer 340 which are included in the adhesive film 300 can be formed from a non-hardening resin layer, and the other can be a hardening resin layer. The hardening resin layer can be formed from a high modulus resin material. Preferably, the hardening resin layer can be formed from a resin material with a modulus range of about 1000~1100 MPa.

Moreover, a polymer layer can be additionally formed between the first adhesive layer 310 and the second adhesive layer 340, when the resin layer of the first adhesive layer 310 and the resin layer 320 of the second adhesive layer 340 are formed from different materials from each other. The polymer layer formed between the first and second adhesive layers 310 and 340 of the different resin materials can enhance an adhesive strength of the first and second adhesive layers 310 and 340 and allow the substrates to be easily combined with each other.

Figure 3:
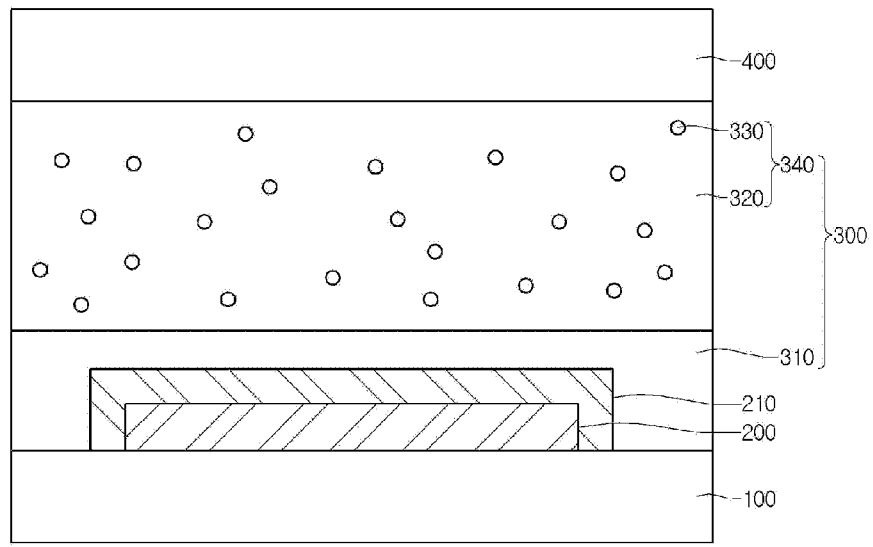
FIG. 3 is a cross-sectional view showing an organic light emitting display device according to a first embodiment of the present disclosure.

FIG. 3 is a cross-sectional view showing an organic light emitting display device according to a first embodiment of the present disclosure.

Referring to FIG. 3, the organic light emitting display device according to a first embodiment of the present disclosure can be fabricated by combining an element substrate 100, which is provided with an organic light emitting element 200 and a protective layer 210 and shown in FIG. 1, and a sealing substrate 400 with having an adhesive film 300, which is disclosed in FIG. 2, therebetween More specifically, the organic light emitting element 200 is formed on the element substrate 100 provided with the thin film transistor TFT in such a manner as to be electrically connected to the thin film transistor TFT. The protective layer 210 is formed on the organic light emitting element 200. The adhesive film 300 with sequentially stacked first and second adhesive layers 310 and 340 is formed on the protective layer 210. At this time, the first adhesive layer 310 is disposed in such a manner as to come in direct contact with the protective layer 210. In other words, the second adhesive layer 340 including the filler 330 is disposed in such a manner as to be separate from the protective layer 210.

Also, the sealing substrate 400 is disposed on the second adhesive layer 340 of the adhesive film 300. The sealing substrate 400 can be formed from insulation glass, a metal material or a plastic material. The sealing substrate 400 and the element substrate 100, which is provided with the organic light emitting element 200 and the protective layer 210, are combined with each other. In accordance therewith, the organic light emitting display device is fabricated.

The adhesive film of the related organic light emitting display device is formed from a hardening resin layer. As such, when a content of the filler increases, the filler 330 expands by moisture and generates stresses applying from the interior of the organic light emitting display device toward all directions. Due to this, a lift phenomenon must be generated in the related organic light emitting display device.

Meanwhile, the adhesive film 300 according to the present disclosure can allow the resin layer of the first adhesive layer 310 or the resin material 320 of the second adhesive layer 340 to be formed from a non-hardening resin layer. As such, stress caused by the expansion of the filler 330 can be relaxed even though a content of the filler 330 increases and the filler 330 expands by moisture. In accordance therewith, the content of the filler 330 of the organic light emitting display device according to the present disclosure can increase about twice through triple compared to that of the related organic light emitting display device. As a result, the organic light emitting display device according to the present disclosure can efficiently prevent the intrusion of moisture.

Figure 4:
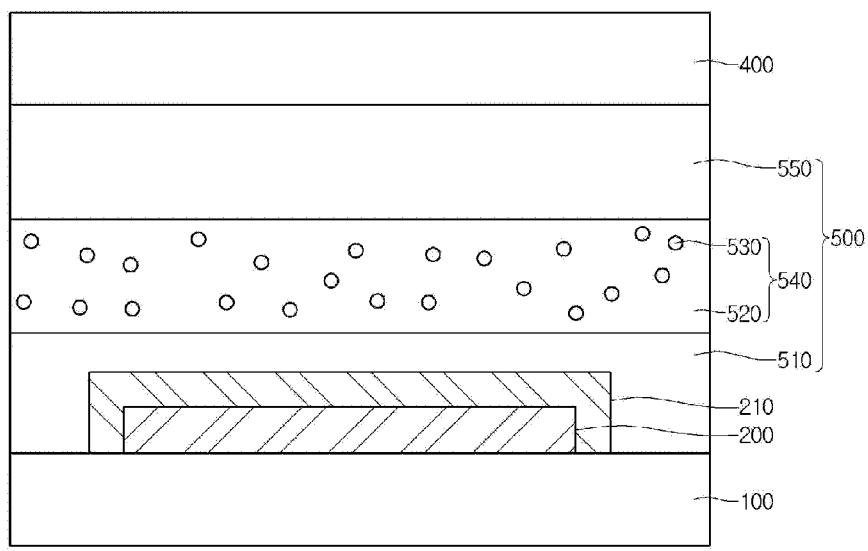
FIG. 4 is a cross-sectional view showing an organic light emitting display device according to a second embodiment of the present disclosure.

FIG. 4 is a cross-sectional view showing an organic light emitting display device according to a second embodiment of the present disclosure. The organic light emitting display device of the second embodiment has a similar configuration to that of the first embodiment. As such, the description of the second embodiment overlapping with the first embodiment will be omitted.

Referring to FIG. 4, an organic light emitting element 200 electrically connected to a thin film transistor TFT is formed on an element substrate 100 provided with the thin film transistor TFT. A protective layer 210 is formed on the organic light emitting element 200. An adhesive film 500 is disposed on the protective layer 210. A sealing substrate 400 and the element substrate 100 are combined with having the adhesive film 500 therebetween.

The adhesive film 500 is formed by sequentially stacking a first adhesive layer 510, a second adhesive layer 540 and a third adhesive layer 550. Each of the first and third adhesive layers 510 and 550 is configured to include only a resin layer, but the second adhesive layer 540 is configured to include a resin layer 520 and filler 530.

The filler 530 included into the second adhesive layer 540 is used as a moisture absorbent, in order to prevent the organic light emitting element 200 from the intrusion of moisture. The filler 530 can be compounded of at least one selected from a material group which includes lithium oxide, sodium oxide, barium oxide, calcium oxide, magnesium oxide, lithium sulfate, sodium sulfate and calcium sulfate. Also, the filler 530 has a property of expanding by moisture.

Also, at least one of the first through third adhesive layers 510, 540 and 550 can be formed from a non-hardening resin layer. As such, stress caused by the expansion of the filler 530 can be relaxed even though a content of the filler 530 increases and the filler 530 expands by moisture.

The non-hardening resin layer can be from a low modulus resin material. The non-hardening resin layer can be from a resin material with a modulus range of about 0.1~900 MPa. Preferably, the non-hardening resin layer can be formed from a resin material with a modulus range of 200~300 MPa. Such a non-hardening resin layer can be formed from at least one selected from a material group which includes a polyolefine-based resin material, a polyacrylic-based resin material, isobutylene, polyamide and polyimide.

For example, all of the first through third adhesive layers 510, 540 and 550 can be formed from the non-hardening resin layer. For example, the resin layer of the first adhesive layer 510, the resin layer 520 of the second adhesive layer 540 and the resin layer of the third adhesive layer 550 can be formed from a low modulus resin material. In other words, the resin layers of the first through third adhesive layers 510, 540 and 550 can be formed from the same material.

Alternatively, the resin layer 520 of the second adhesive layer 540 can be formed from a different material from the resin layers of the first and third adhesive layers 510 and 550. In this case, the resin layers of the first and third adhesive layers 510 and 550 can be formed from a non-hardening resin layer, and the resin layer 520 of the second adhesive layer 540 can be formed from a hardening resin layer. The hardening resin layer can be formed from a high modulus resin material.

Preferably, the hardening resin layer can be formed from a resin material with a modulus range of about 1000~1100 MPa.

Meanwhile, if the adhesive layers adjacent to each other are formed from different materials from each other, a polymer layer can be additionally formed between the adjacent adhesive layers. Actually, when the resin layer of the first adhesive layer 510 and the resin layer 520 of the second adhesive layer 540 are formed from the different materials from each other, the polymer layer is additionally formed between the first and second adhesive layers 510 and 540. Also, if the resin layer 520 of the second adhesive layer 540 and the resin layer of the third adhesive layer 550 are formed from the different materials from each other, the polymer layer is additionally formed between the second and third adhesive layers 540 and 550. Such a polymer layer formed between the adjacent adhesive layers of different materials can enhance an adhesive strength of the first and second adhesive layers 510 and 540 or an adhesive strength of the second and third adhesive layers 540 and 550, and allow the substrates to be easily combined with each other.

In other words, the adhesive film 500 according to the present disclosure can allow at least one of the resin layers of the adhesive layers to become a non-hardening resin layer. As such, stress caused by the expansion of the filler 530 can be relaxed even though a content of the filler 530 increases and the filler 530 expands by moisture. Therefore, the content of the filler of the organic light emitting display device according to the present disclosure can increase about twice through triple compared to that of the related organic light emitting display device.

As described above, the organic light emitting display device according to the present disclosure uses a low modulus material. As such, not only stress caused by the expansion of the filler can be relaxed but also the peeling off of the adhesive layer can be prevented, even though a content of the filler increases and the filler expands by moisture. Also, the organic light emitting display device according to the present disclosure can prevent the contractive fault of a pixel due to the intrusion of moisture and enhance the performance of the adhesive layer, by increasing the content of the filler. In accordance therewith, the life span of the organic light emitting display device can be extended in the environment of high temperature and humidity.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. An organic light emitting display device comprising:
    an element substrate provided with a thin film transistor;
    an organic light emitting element electrically connected to the thin film transistor and formed on the element substrate;
    a protective layer formed on the organic light emitting element;
    an adhesive film configured to include a first adhesive layer and a second adhesive layer which are sequentially stacked on the protective layer, the first adhesive layer including a resin layer and the second adhesive layer including another resin layer and a filler; and a sealing substrate disposed on the second adhesive layer and combined with the element substrate, which is provided with the organic light emitting element, by the adhesive film, wherein one of the resin layers of the first and second adhesive layers within the adhesive film is formed from a non-hardening resin layer.

2. The organic light emitting display device of claim 1, wherein the non-hardening resin layer is formed from a resin material with a modulus range of about 0.1~900 MPa.

3. The organic light emitting display device of claim 1, wherein the resin layer of the first adhesive layer and the resin layer of the second adhesive layer are formed from the non-hardening resin layer.

4. The organic light emitting display device of claim 3, wherein the resin layer of the first adhesive layer and the resin layer of the second adhesive layer are formed from the same material.

5. The organic light emitting display device of claim 1, wherein the resin layer of the first adhesive layer and the resin layer of the second adhesive layer are formed from different materials.

6. The organic light emitting display device of claim 5, wherein one of the resin layers of the first and second adhesive layers within the adhesive film is formed from the non-hardening resin layer and the other is formed from a hardening resin layer.

7. The organic light emitting display device of claim 6, wherein the hardening resin layer is formed from a resin material with a modulus range of about 1000~1100 MPa.

8. The organic light emitting display device of claim 5, further comprising a polymer layer disposed between the first adhesive layer and the second adhesive layer and configured to combine the first adhesive layer and the second adhesive layer.

9. The organic light emitting display device of claim 1, wherein the non-hardening resin layer is formed from at least one selected from a material group which includes a polyolefine-based resin material, a polyacrylic-based resin material, isobutylene, polyamide and polyimide.

10. The organic light emitting display device of claim 1, wherein the filler of the second adhesive layer is about 40 through 60 wt % with respect to the second adhesive layer.

11. The organic light emitting display device of claim 1, wherein the adhesive film further includes a third adhesive layer which is stacked on the second adhesive layer and formed from still another resin layer, and at least one of the resin layers of the first through third adhesive layers within the adhesive film is formed from the non-hardening resin layer.

12. The organic light emitting display device of claim 11, wherein the resin layers of the first and third adhesive layers are formed from the non-hardening resin layer and the resin layer of the second adhesive layer is formed from a hardening resin layer.

13. The organic light emitting display device of claim 12, further comprising polymer layers disposed between the first and second adhesive layers and between the second and third adhesive layers and configured to combined the adhesive layers adjacent thereto.

\* \* \* \* \*